(12) United States Patent
Tay et al.

(10) Patent No.: US 7,763,493 B2
(45) Date of Patent: Jul. 27, 2010

(54) INTEGRATED CIRCUIT PACKAGE SYSTEM WITH TOP AND BOTTOM TERMINALS

(75) Inventors: Lionel Chien Hui Tay, Singapore (SG); Henry Descalzo Bathan, Singapore (SG); Zigmund Ramirez Camacho, Singapore (SG)

(73) Assignee: Stats Chippac Ltd., Singapore (SG)

( * ) Notice: Subject to any disclaimer, the term of this patent is extended or adjusted under 35 U.S.C. 154(b) by 152 days.

(21) Appl. No.: 11/768,730

(22) Filed: Jun. 26, 2007

(65) Prior Publication Data
US 2009/0001539 A1    Jan. 1, 2009

(51) Int. Cl.
*H01L 21/00* (2006.01)
(52) U.S. Cl. ............... 438/106; 257/E33.059
(58) Field of Classification Search ........ 257/666, 257/676, 685, 686, 774, E23.039, E23.04, 257/E23.085, E21.499, E23.116, E23.129, 257/787, E51.02, E33.059, E31.117, E21.511
See application file for complete search history.

(56) References Cited

U.S. PATENT DOCUMENTS

| | | | |
|---|---|---|---|
| 5,608,265 A * | 3/1997 | Kitano et al. | 257/738 |
| 6,384,471 B1 | 5/2002 | Petit et al. | |
| 6,614,104 B2 * | 9/2003 | Farnworth et al. | 257/686 |
| 6,774,478 B2 | 8/2004 | Eto et al. | |
| 6,781,242 B1 | 8/2004 | Fan et al. | |
| 6,849,949 B1 | 2/2005 | Lyu et al. | |
| 7,012,325 B2 * | 3/2006 | Ahn et al. | 257/678 |
| 2005/0046005 A1 * | 3/2005 | Bowen | 257/686 |
| 2005/0184367 A1 * | 8/2005 | Bowen | 257/666 |
| 2006/0073635 A1 | 4/2006 | Su et al. | |
| 2007/0108568 A1 * | 5/2007 | Shim et al. | 257/676 |

* cited by examiner

*Primary Examiner*—Thao P. Le
(74) *Attorney, Agent, or Firm*—Mikio Ishimaru

(57) ABSTRACT

An integrated circuit package system includes a die pad with leads; attaching an integrated circuit over the die pad; attaching a connector to the integrated circuit and the leads; and forming an encapsulant, over the integrated circuit, having a connection cavity over the leads leaving an exposed portion of the leads.

20 Claims, 7 Drawing Sheets

INTEGRATED CIRCUIT PACKAGE SYSTEM WITH TOP AND BOTTOM TERMINALS

TECHNICAL FIELD

The present invention relates generally to integrated circuit package systems, and more particularly to a system for integrated circuit packages with cavity substrate.

BACKGROUND ART

Integrated circuits have become ubiquitous in many portable electronic products, such as cell phones, portable computers, voice recorders, etc. as well as in many larger electronic systems, such as cars, planes, industrial control systems, etc. Across virtually all applications, there continues to be demand for reducing the size and increasing performance of the devices. The intense demand is no more visible than in portable electronics.

The demands for smaller, higher performance semiconductor devices have motivated the development of new techniques for producing smaller and less expensive semiconductor devices. One of these technologies involves packaging the integrated circuit chip in as small a form factor as possible and manufacturing the integrated circuit chip as efficiently as possible.

Usually, many individual devices are constructed on the same wafer. When the devices are separated into individual rectangular units, each takes the form of an integrated circuit chip. In order to interface a chip with other circuitry, it is common to mount it with lead fingers and individually connect pad on the chip to the lead fingers using extremely fine wires. The assemblies are then packaged by individually encapsulating them in molded plastic or ceramic bodies.

Virtually all electronic products benefit from increasing features (including functions and performance) in integrated circuit chips all while being designed into ever smaller physical space. These demands are often very visible with the many consumer electronic products including but not limited to personal portable devices, such as cellular phones, digital cameras, and music players.

Integrated circuit packaging technology has shown an increase in the number of chips mounted on a single circuit board or substrate that parallels the reduction in the number of components needed for a circuit. This results in packaging designs that are more compact, in the physical size and shape of a device, and in a significant increase in overall integrated circuit density. However, integrated circuit density continues to be limited by the area available for mounting chips on a substrate.

Some packages have been developed in which more than one device can be packaged at one time at each package site to condense the packaging of individual devices. Each package site is a structure that provides mechanical support for the individual integrated circuit devices. It also provides one or more layers of interconnect lines that enable the devices to be connected electrically to surrounding circuitry.

Other packages have been developed in which more than one package can be combined to condense the packaging of multiple devices. Each package is a structure that provides mechanical support for individual packages. It also provides one or more layers of interconnect materials that enable packages to be connected electrically to surrounding circuitry.

In some cases, multi-chip devices can be fabricated faster and more cheaply than a corresponding single integrated circuit chip that incorporates all the same functions. Some multi-chip modules have been found to increase circuit density and miniaturization, improve signal propagation speed, reduce overall device size, improve performance, and lower costs.

However, such multi-chip modules can be bulky. Package density is determined by the area required to mount a chip or module on a circuit board. One method for reducing the board size of multi-chip modules and thereby increase their effective density is to stack the chips vertically within the module or package. Such designs are improvements over prior packages that combined several chips and associated passive components side by side in a single, horizontal layer.

Despite the advantages of recent developments in semiconductor fabrication and packaging techniques, there is a continuing need for improving compatibility of components, simplifying manufacturing processes, reducing footprint area, and increasing inter-device performance.

Thus, a need still remains for an integrated circuit package system to provide ease of integration, compatibility with various packaging technologies, simplification of manufacturing processes, and reduction or elimination of other manufacturing processes. In view of the increasing demand for improved density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a die pad with leads; attaching an integrated circuit over the die pad; attaching a connector to the integrated circuit and the leads; and forming an encapsulant, over the integrated circuit, having a connection cavity over the leads leaving an exposed portion of the leads.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
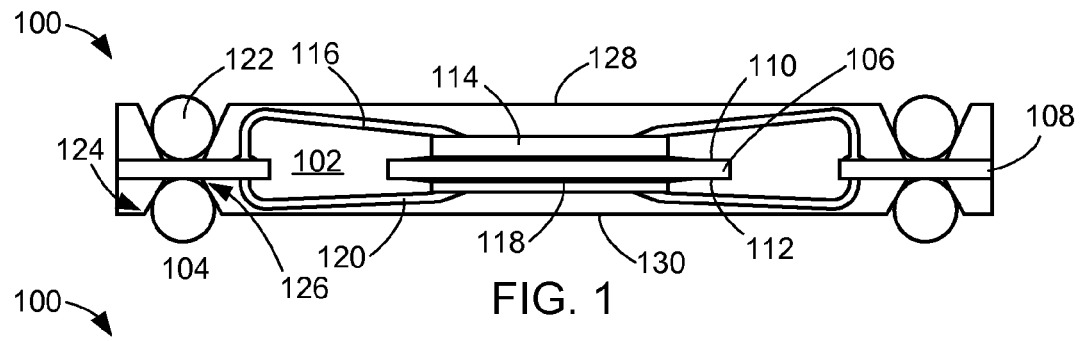
FIG. 1 is a cross-sectional view of an integrated circuit package system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 2:
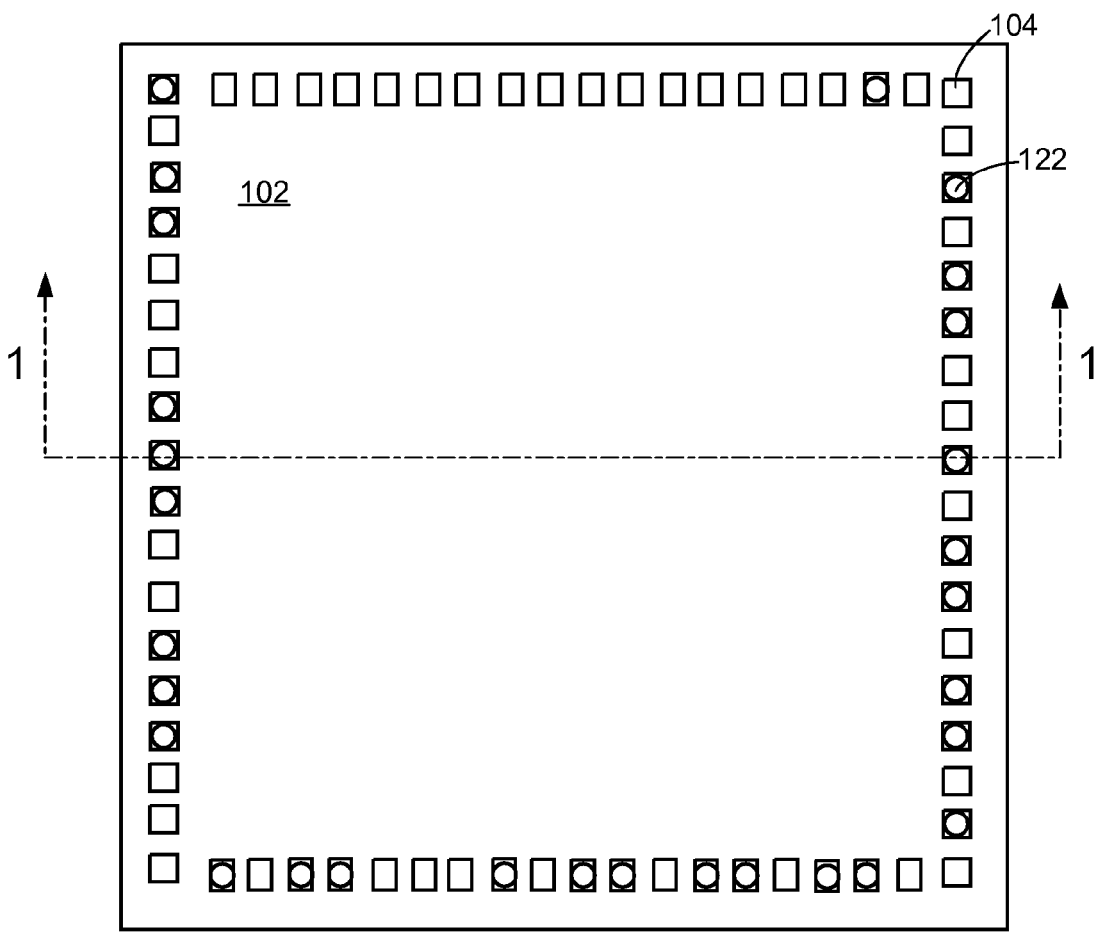
FIG. 2 is a top plan view of the integrated circuit package system.

Referring now to FIG. 1, therein is shown a cross-sectional view of an integrated circuit package system 100 taken along line 1-1 of FIG. 2 in a first embodiment of the present invention. The integrated circuit package system 100 preferably includes an encapsulant 102 having a connection cavity 104.

The integrated circuit package system 100 preferably also includes a die pad 106 and leads 108. The die pad 106 and the leads 108 can be formed as a lead frame, a substrate, or any other die carrier with electrode. The die pad 106 can include a first die pad surface 110 opposite a second die pad surface 112.

A first integrated circuit 114 can be attached over the first die pad surface 110 with a connection side of the first integrated circuit 114 facing away from the die pad 106, and electrically connected to the leads 108 with a first connector 116 such as a bond wire or other conductor. Similarly, a second integrated circuit 118 can be attached over the second die pad surface 112 with a connection side of the second integrated circuit 118 facing away from the die pad 106, and electrically connected to the leads 108 with a second connector 120 such as a bond wire or other conductor. The term: "connection side" is defined as a side of the integrated circuit having electrical connections with a connector such as the first connector 116 or the second connector 120.

The connection cavity 104 preferably forms a receptacle for the option of a conductive material 122 such as an electrical connector. The connection cavity 104 can include an open outer end 124 near the first die pad surface 110 or the second die pad surface 112 and a closed inner end 126 near an exposed portion of the leads 108.

The connection cavity 104 can optionally be non-connected (NC) without the conductive material 122. A first encapsulant surface 128 or a second encapsulant surface 130 can provide spacing from the open outer end 124 of the connection cavity 104 to the exposed portion of the leads 108 near the closed inner end 126 of the connection cavity 104.

The conductive material 122 can be formed partially in the connection cavity 104 as a solder ball, a plug, or other shape. The conductive material 122 can preferably provide an exposed portion of the conductive material 122 beyond the first encapsulant surface 128 or the second encapsulant surface 130 as a terminal lead for electrical or mechanical connectivity to a next level system such as another package or a printed circuit board (PCB).

The conductive material 122 can be formed over the exposed portion of the leads 108. Electrical connectivity can be provided to the leads 108 and in turn to the first connector 116 or the second connector 120 respectively. The first integrated circuit 114 or the second integrated circuit 118 is electrically connected thereby to the conductive material 122 and a next level system.

It has been discovered that the integrated circuit package system 100 with cavity substrate provides compatibility with various packaging technologies such as leadframe or substrate, simplification of manufacturing processes, and reduction or elimination of other manufacturing processes.

Referring now to FIG. 2 therein is shown a top plan view of the integrated circuit package system 100. The integrated circuit package system 100 preferably includes the encapsulant 102 having the connection cavity 104. The integrated circuit package system 100 also includes the conductive material 122.

The conductive material 122 can be formed partially in the connection cavity 104 and preferably provide an exposed portion of the conductive material 122 as a terminal lead for electrical or mechanical connectivity. The conductive material 122 can provide electrical connectivity to the next level system.

The connection cavity 104 preferably forms a receptacle for an option of forming the conductive material 122. The connection cavity 104 can optionally be non-connected (NC) to the next level system without forming the conductive material 122 in the connection cavity 104.

Figure 3:
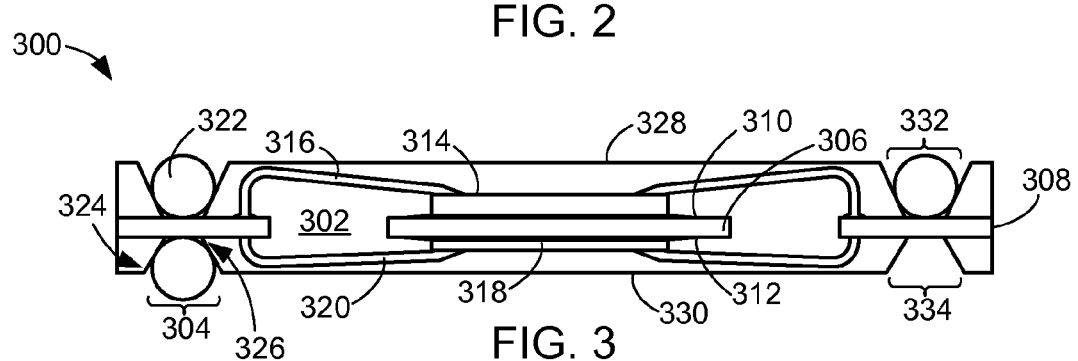
FIG. 3 is a cross-sectional view of an integrated circuit package system in a second embodiment of the present invention.

Referring now to FIG. 3, therein is shown a cross-sectional view of an integrated circuit package system 300 in a second embodiment of the present invention. The integrated circuit package system 300 preferably includes an encapsulant 302 having a connection cavity 304.

The integrated circuit package system 300 preferably also includes a die pad 306 and leads 308. The die pad 306 and the leads 308 can be formed as a lead frame, a substrate, or any other die carrier with electrode. The die pad 306 can include a first die pad surface 310 opposite a second die pad surface 312.

A first integrated circuit 314 can be attached over the first die pad surface 310 and electrically connected to the leads 308 with a first connector 316 such as a bond wire or other conductor. Similarly, a second integrated circuit 318 can be attached over the second die pad surface 312 and electrically connected to the leads 308 with a second connector 320 such as a bond wire or other conductor.

The connection cavity 304 preferably forms a receptacle for the option of a conductive material 322 such as an electrical connector. The connection cavity 304 can include an open outer end 324 near the first die pad surface 310 or the second die pad surface 312 and a closed inner end 326 near an exposed portion of the leads 308.

The connection cavity 304 can optionally be non-connected (NC) without the conductive material 322. A first encapsulant surface 328 or a second encapsulant surface 330 can provide spacing from the open outer end 324 of the connection cavity 304 to the exposed portion of the leads 308 near the closed inner end 326 of the connection cavity 304.

The conductive material 322 can be formed partially in the connection cavity 304 as a solder ball, a plug, or other shape. The conductive material 322 can preferably provide an exposed portion of the conductive material 322 beyond the first encapsulant surface 328 or the second encapsulant surface 330 as a terminal lead for electrical or mechanical connectivity to a next level system such as another package or a printed circuit board (PCB).

The conductive material 322 can be formed over the exposed portion of the leads 308. Electrical connectivity can be provided to the leads 308 and in turn to the first connector 316 or the second connector 320 respectively. The first integrated circuit 314 or the second integrated circuit 318 is electrically connected thereby to the conductive material 322 and a next level system.

The integrated circuit package system 300 includes a filled connection cavity 332 over a non-filled connection cavity 334. At least one of the leads 308 can preferably be connected to a next level system over the first encapsulant surface 328 and non-connected to a next level system over the second encapsulant surface 330.

Figure 4:
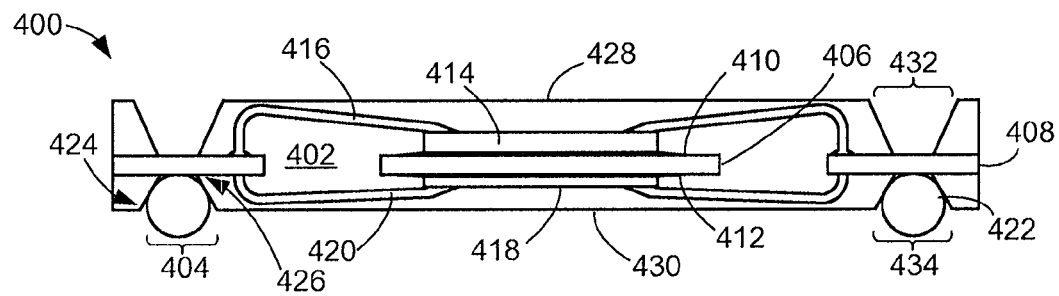
FIG. 4 is a cross-sectional view of an integrated circuit package system in a third embodiment of the present invention.

Referring now to FIG. 4, therein is shown a cross-sectional view of an integrated circuit package system 400 in a third embodiment of the present invention. The integrated circuit package system 400 preferably includes an encapsulant 402 having a connection cavity 404.

The integrated circuit package system 400 preferably also includes a die pad 406 and leads 408. The die pad 406 and the leads 408 can be formed as a lead frame, a substrate, or any other die carrier with electrode. The die pad 406 can include a first die pad surface 410 opposite a second die pad surface 412.

A first integrated circuit 414 can be attached over the first die pad surface 410 and electrically connected to the leads 408 with a first connector 416 such as a bond wire or other conductor. Similarly, a second integrated circuit 418 can be attached over the second die pad surface 412 and electrically connected to the leads 408 with a second connector 420 such as a bond wire or other conductor.

The connection cavity 404 preferably forms a receptacle for the option of a conductive material 422 such as an electrical connector. The connection cavity 404 can include an open outer end 424 near the first die pad surface 410 or the second die pad surface 412 and a closed inner end 426 near an exposed portion of the leads 408.

The connection cavity 404 can optionally be non-connected (NC) without the conductive material 422. A first encapsulant surface 428 or a second encapsulant surface 430 can provide spacing from the open outer end 424 of the connection cavity 404 to the exposed portion of the leads 408 near the closed inner end 426 of the connection cavity 404.

The conductive material 422 can be formed partially in the connection cavity 404 as a solder ball, a plug, or other shape. The conductive material 422 can preferably provide an exposed portion of the conductive material 422 beyond the first encapsulant surface 428 or the second encapsulant surface 430 as a terminal lead for electrical or mechanical connectivity to a next level system such as another package or a printed circuit board (PCB).

The conductive material 422 can be formed over the exposed portion of the leads 408. Electrical connectivity can be provided to the leads 408 and in turn to the first connector 416 or the second connector 420 respectively. The first integrated circuit 414 or the second integrated circuit 418 is electrically connected thereby to the conductive material 422 and a next level system.

The integrated circuit package system 400 includes a non-filled connection cavity 432 over a filled connection cavity 434. Two or more of the leads 408 can preferably be non-connected to a next level system over the first encapsulant surface 428 and connected to a next level system over the second encapsulant surface 430.

Figure 5:
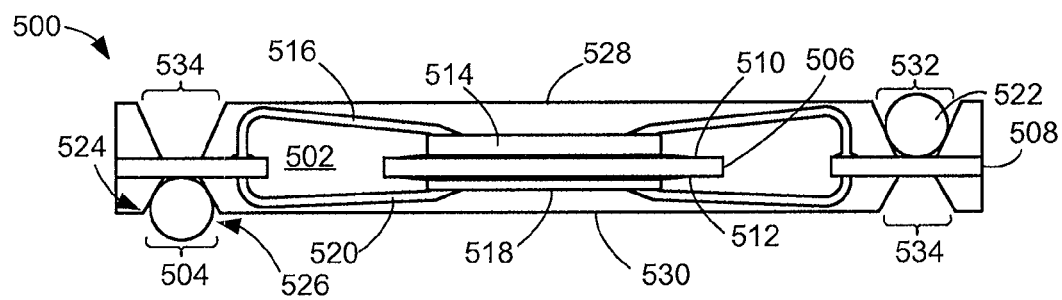
FIG. 5 is a cross-sectional view of an integrated circuit package system in a fourth embodiment of the present invention.

Referring now to FIG. 5, therein is shown a cross-sectional view of an integrated circuit package system 500 in a fourth embodiment of the present invention. The integrated circuit package system 500 preferably includes an encapsulant 502 having a connection cavity 504.

The integrated circuit package system 500 preferably also includes a die pad 506 and leads 508. The die pad 506 and the leads 508 can be formed as a lead frame, a substrate, or any other die carrier with electrode. The die pad 506 can include a first die pad surface 510 opposite a second die pad surface 512.

A first integrated circuit 514 can be attached over the first die pad surface 510 and electrically connected to the leads 508 with a first connector 516 such as a bond wire or other conductor. Similarly, a second integrated circuit 518 can be attached over the second die pad surface 512 and electrically connected to the leads 508 with a second connector 520 such as a bond wire or other conductor.

The connection cavity 504 preferably forms a receptacle for the option of a conductive material 522 such as an electrical connector. The connection cavity 504 can include an open outer end 524 near the first die pad surface 510 or the second die pad surface 512 and a closed inner end 526 near an exposed portion of the leads 508.

The connection cavity 504 can optionally be non-connected (NC) without the conductive material 522. A first encapsulant surface 528 or a second encapsulant surface 530 can provide spacing from the open outer end 524 of the connection cavity 504 to the exposed portion of the leads 508 near the closed inner end 526 of the connection cavity 504.

The conductive material 522 can be formed partially in the connection cavity 504 as a solder ball, a plug, or other shape. The conductive material 522 can preferably provide an exposed portion of the conductive material 522 beyond the first encapsulant surface 528 or the second encapsulant surface 530 as a terminal lead for electrical or mechanical connectivity to a next level system such as another package or a printed circuit board (PCB).

The conductive material 522 can be formed over the exposed portion of the leads 508. Electrical connectivity can be provided to the leads 508 and in turn to the first connector 516 or the second connector 520 respectively. The first integrated circuit 514 or the second integrated circuit 518 is electrically connected thereby to the conductive material 522 and a next level system.

The integrated circuit package system 500 includes at least one of a filled connection cavity 532 over at least one of a non-filled connection cavity 534 as well as at least one of another of the non-filled connection cavity 534 over at least one of another of the filled connection cavity 532.

At least one of the leads 508 can preferably be connected to a next level system over the first encapsulant surface 528 and non-connected to a next level system over the second encapsulant surface 530. Further, at least one of the leads 508 can preferably be non-connected to a next level system over the first encapsulant surface 528 and connected to a next level system over the second encapsulant surface 530.

Figure 6:
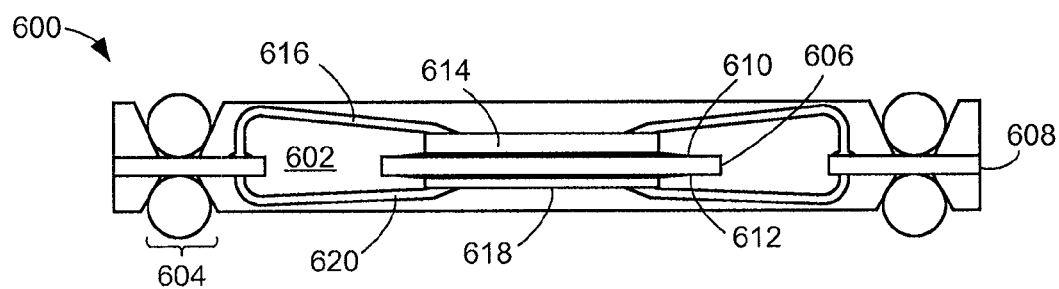
FIG. 6 is a cross-sectional view of an integrated circuit package system in a fifth embodiment of the present invention.

Referring now to FIG. 6, therein is shown a cross-sectional view of an integrated circuit package system 600 in a fifth embodiment of the present invention. The integrated circuit package system 600 preferably includes an encapsulant 602 having a connection cavity 604.

The integrated circuit package system 600 preferably also includes a die pad 606 and leads 608. The die pad 606 and the leads 608 can be formed as a lead frame, a substrate, or any other die carrier with electrode. The die pad 606 can include a first die pad surface 610 opposite a second die pad surface 612.

A first integrated circuit 614 can be attached over the first die pad surface 610 and electrically connected to the leads 608 with a first connector 616 such as a bond wire or other conductor. Similarly, a second integrated circuit 618 can be attached over the second die pad surface 612 and electrically connected to the leads 608 with a second connector 620 such as a bond wire or other conductor.

The integrated circuit package system 600 is similar to the integrated circuit package system 100 except that the first integrated circuit 614 is substantially the same as the second integrated circuit 618.

Figure 7:
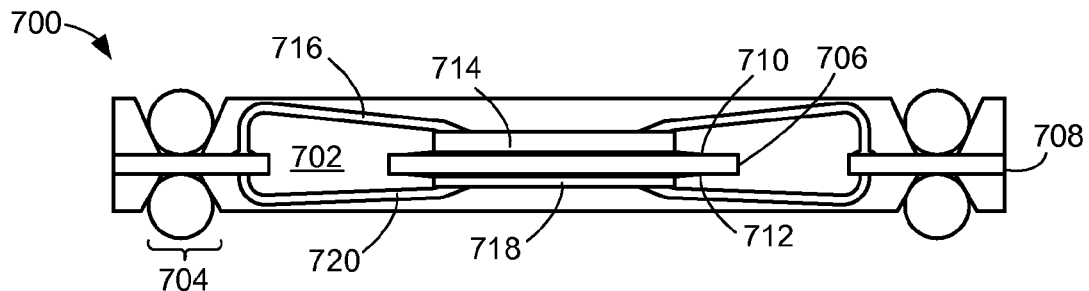
FIG. 7 is a cross-sectional view of an integrated circuit package system in a sixth embodiment of the present invention.

Referring now to FIG. 7, therein is shown a cross-sectional view of an integrated circuit package system 700 in a sixth embodiment of the present invention. The integrated circuit package system 700 preferably includes an encapsulant 702 having a connection cavity 704.

The integrated circuit package system 700 preferably also includes a die pad 706 and leads 708. The die pad 706 and the leads 708 can be formed as a lead frame, a substrate, or any other die carrier with electrode. The die pad 706 can include a first die pad surface 710 opposite a second die pad surface 712.

A first integrated circuit 714 can be attached over the first die pad surface 710 and electrically connected to the leads 708 with a first connector 716 such as a bond wire or other conductor. Similarly, a second integrated circuit 718 can be attached over the second die pad surface 712 and electrically connected to the leads 708 with a second connector 720 such as a bond wire or other conductor.

The integrated circuit package system 700 is similar to the integrated circuit package system 100 except that the first integrated circuit 714 is different from the second integrated circuit 718 although the first integrated circuit 714 and the second integrated circuit 718 have similar dimensions.

Figure 8:
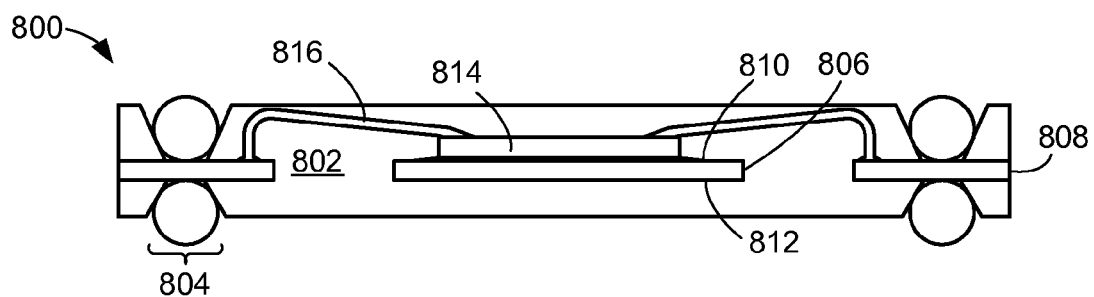
FIG. 8 is a cross-sectional view of an integrated circuit package system in a seventh embodiment of the present invention.

Referring now to FIG. 8, therein is shown a cross-sectional view of an integrated circuit package system 800 in a seventh embodiment of the present invention. The integrated circuit package system 800 preferably includes an encapsulant 802 having a connection cavity 804.

The integrated circuit package system 800 preferably also includes a die pad 806 and leads 808. The die pad 806 and the leads 808 can be formed as a lead frame, a substrate, or any other die carrier with electrode. The die pad 806 can include a first die pad surface 810 opposite a second die pad surface 812.

An integrated circuit 814 can be attached over the first die pad surface 810 and electrically connected to the leads 808 with a first connector 816 such as a bond wire or other conductor.

The integrated circuit package system 800 is similar to the integrated circuit package system 100 except that the integrated circuit package system 800 includes only one of the integrated circuit 814. For illustrative purposes, the integrated circuit 814 is shown mounted over the first die pad surface 810 although it is understood that the integrated circuit 814 may be mounted over the second die pad surface 812.

Figure 9:
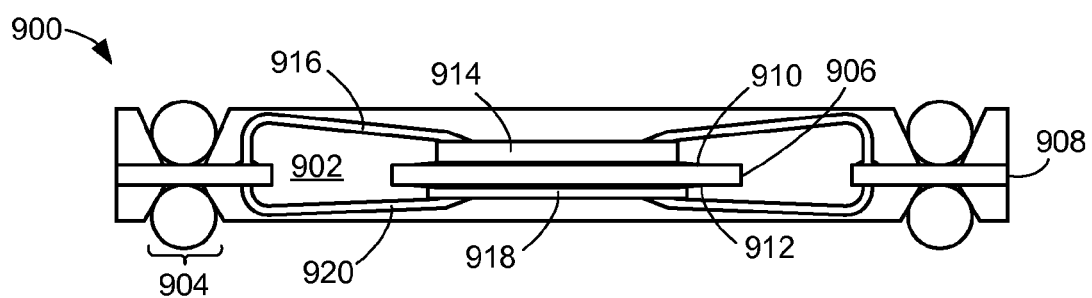
FIG. 9 is a cross-sectional view of an integrated circuit package system in an eighth embodiment of the present invention.

Referring now to FIG. 9, therein is shown a cross-sectional view of an integrated circuit package system 900 in an eighth embodiment of the present invention. The integrated circuit package system 900 preferably includes an encapsulant 902 having a connection cavity 904.

The integrated circuit package system 900 preferably also includes a die pad 906 and leads 908. The die pad 906 and the leads 908 can be formed as a lead frame, a substrate, or any other die carrier with electrode. The die pad 906 can include a first die pad surface 910 opposite a second die pad surface 912.

A first integrated circuit 914 can be attached over the first die pad surface 910 and electrically connected to the leads 908 with a first connector 916 such as a bond wire or other conductor. Similarly, a second integrated circuit 918 can be attached over the second die pad surface 912 and electrically connected to the leads 908 with a second connector 920 such as a bond wire or other conductor.

The integrated circuit package system 900 is similar to the integrated circuit package system 100 except that the first integrated circuit 914 and the second integrated circuit 918 have different dimensions.

Figure 10:
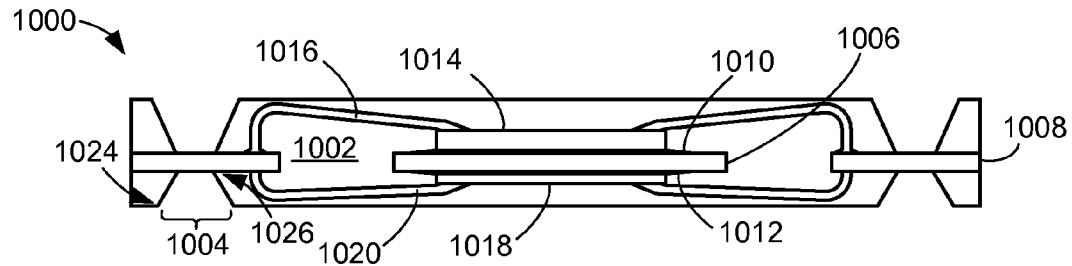
FIG. 10 is a cross-sectional view of an integrated circuit package system in a ninth embodiment of the present invention.

Referring now to FIG. 10, therein is shown a cross-sectional view of an integrated circuit package system 1000 in a ninth embodiment of the present invention. The integrated circuit package system 1000 preferably includes an encapsulant 1002 having a connection cavity 1004.

The integrated circuit package system 1000 preferably also includes a die pad 1006 and leads 1008. The die pad 1006 and the leads 1008 can be formed as a lead frame, a substrate, or any other die carrier with electrode. The die pad 1006 can include a first die pad surface 1010 opposite a second die pad surface 1012.

A first integrated circuit 1014 can be attached over the first die pad surface 1010 and electrically connected to the leads 1008 with a first connector 1016 such as a bond wire or other conductor. Similarly, a second integrated circuit 1018 can be attached over the second die pad surface 1012 and electrically connected to the leads 1008 with a second connector 1020 such as a bond wire or other conductor.

The connection cavity 1004 preferably forms a receptacle for the option of a conductive material 1022 such as an electrical connector. The connection cavity 1004 can include an open outer end 1024 near the first die pad surface 1010 or the second die pad surface 1012 and a closed inner end 1026 near an exposed portion of the leads 1008.

For illustrative purposes, the connection cavity 1004 is shown having a cross-sectional shape of a trapezoid having the open outer end 1024 wider than the closed inner end 1026 although it is understood that the connection cavity 1004 may be of any shape or dimension.

Figure 11:
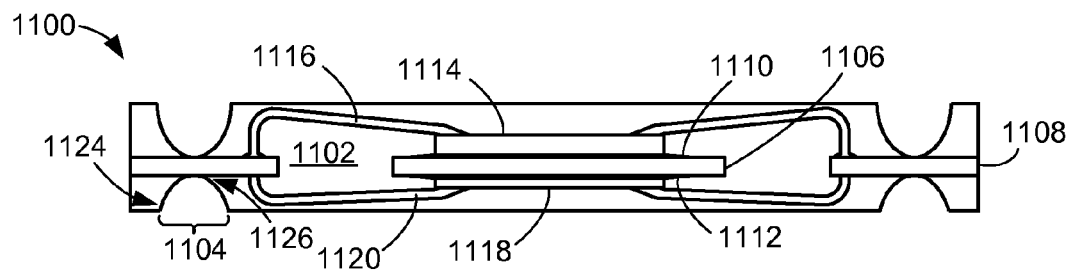
FIG. 11 is a cross-sectional view of an integrated circuit package system in a tenth embodiment of the present invention.

Referring now to FIG. 11, therein is shown a cross-sectional view of an integrated circuit package system 1100 in a tenth embodiment of the present invention. The integrated circuit package system 1100 preferably includes an encapsulant 1102 having a connection cavity 1104.

The integrated circuit package system 1100 preferably also includes a die pad 1106 and leads 1108. The die pad 1106 and the leads 1108 can be formed as a lead frame, a substrate, or any other die carrier with electrode. The die pad 1106 can include a first die pad surface 1110 opposite a second die pad surface 1112.

A first integrated circuit 1114 can be attached over the first die pad surface 1110 and electrically connected to the leads 1108 with a first connector 1116 such as a bond wire or other conductor. Similarly, a second integrated circuit 1118 can be attached over the second die pad surface 1112 and electrically connected to the leads 1108 with a second connector 1120 such as a bond wire or other conductor.

The connection cavity 1104 preferably forms a receptacle for the option of a conductive material 1122 such as an electrical connector. The connection cavity 1104 can include an open outer end 1124 near the first die pad surface 1110 or the second die pad surface 1112 and a closed inner end 1126 near an exposed portion of the leads 1108.

For illustrative purposes, the connection cavity 1104 is shown having a cross-sectional shape of a partial ellipse having the open outer end 1124 wider than the closed inner end 1126 although it is understood that the connection cavity 1104 may be of any shape or dimension.

Figure 12:
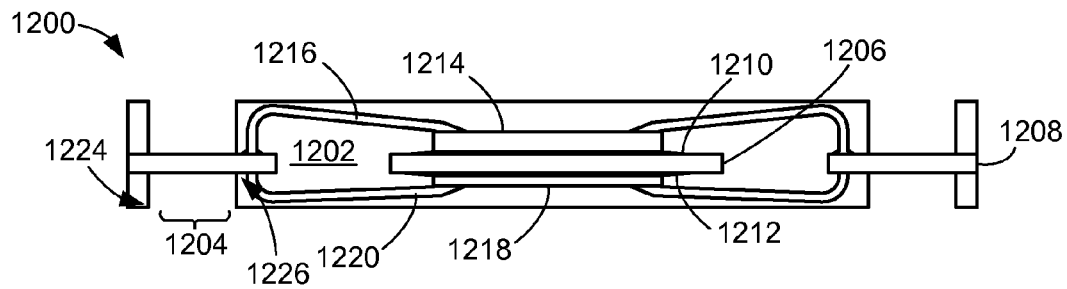
FIG. 12 is a cross-sectional view of an integrated circuit package system in an eleventh embodiment of the present invention.

Referring now to FIG. 12, therein is shown a cross-sectional view of an integrated circuit package system 1200 in an eleventh embodiment of the present invention. The integrated circuit package system 1200 preferably includes an encapsulant 1202 having a connection cavity 1204.

The integrated circuit package system 1200 preferably also includes a die pad 1206 and leads 1208. The die pad 1206 and the leads 1208 can be formed as a lead frame, a substrate, or any other die carrier with electrode. The die pad 1206 can include a first die pad surface 1210 opposite a second die pad surface 1212.

A first integrated circuit 1214 can be attached over the first die pad surface 1210 and electrically connected to the leads 1208 with a first connector 1216 such as a bond wire or other conductor. Similarly, a second integrated circuit 1218 can be attached over the second die pad surface 1212 and electrically connected to the leads 1208 with a second connector 1220 such as a bond wire or other conductor.

The connection cavity 1204 preferably forms a receptacle for the option of a conductive material 1222 such as an electrical connector. The connection cavity 1204 can include an open outer end 1224 near the first die pad surface 1210 or the second die pad surface 1212 and a closed inner end 1226 near an exposed portion of the leads 1208.

For illustrative purposes, the connection cavity 1204 is shown having a cross-sectional shape of a rectangle having the open outer end 1224 similar in size to the closed inner end 1226 although it is understood that the connection cavity 1204 may be of any shape or dimension.

Figure 13:
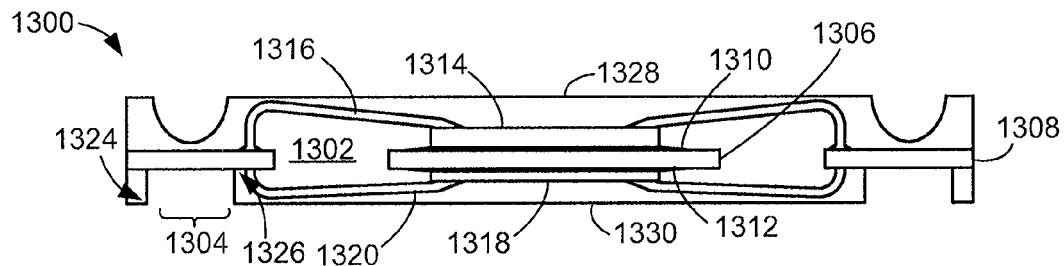
FIG. 13 is a cross-sectional view of an integrated circuit package system in a twelfth embodiment of the present invention.

Referring now to FIG. 13, therein is shown a cross-sectional view of an integrated circuit package system 1300 in a twelfth embodiment of the present invention. The integrated circuit package system 1300 preferably includes an encapsulant 1302 having a connection cavity 1304.

The integrated circuit package system 1300 preferably also includes a die pad 1306 and leads 1308. The die pad 1306 and the leads 1308 can be formed as a lead frame, a substrate, or any other die carrier with electrode. The die pad 1306 can include a first die pad surface 1310 opposite a second die pad surface 1312.

A first integrated circuit 1314 can be attached over the first die pad surface 1310 and electrically connected to the leads 1308 with a first connector 1316 such as a bond wire or other conductor. Similarly, a second integrated circuit 1318 can be attached over the second die pad surface 1312 and electrically connected to the leads 1308 with a second connector 1320 such as a bond wire or other conductor.

The connection cavity 1304 preferably forms a receptacle for the option of a conductive material 1322 such as an electrical connector. The connection cavity 1304 can include an open outer end 1324 near the first die pad surface 1310 or the second die pad surface 1312 and a closed inner end 1326 near an exposed portion of the leads 1308.

The encapsulant can also include a first encapsulant surface 1328 or a second encapsulant surface 1330 providing spacing from the open outer end 1324 of the connection cavity 1304 to the exposed portion of the leads 1308 near the closed inner end 1326 of the connection cavity 1304.

For illustrative purposes, one or more of the connection cavity 1304 is shown near a first encapsulant surface having a cross-sectional shape of a rectangle with the open outer end 1324 similar in size to the closed inner end 1326 although it is understood that the connection cavity 1304 may be of any shape or dimension.

Further, for illustrative purposes one or more of the connection cavity 1304 is also shown near a second encapsulant surface having a cross-sectional shape of a partial ellipse with the open outer end 1324 wider than the closed inner end 1326 although it is understood that the connection cavity 1304 may be of any shape or dimension.

Figure 14:
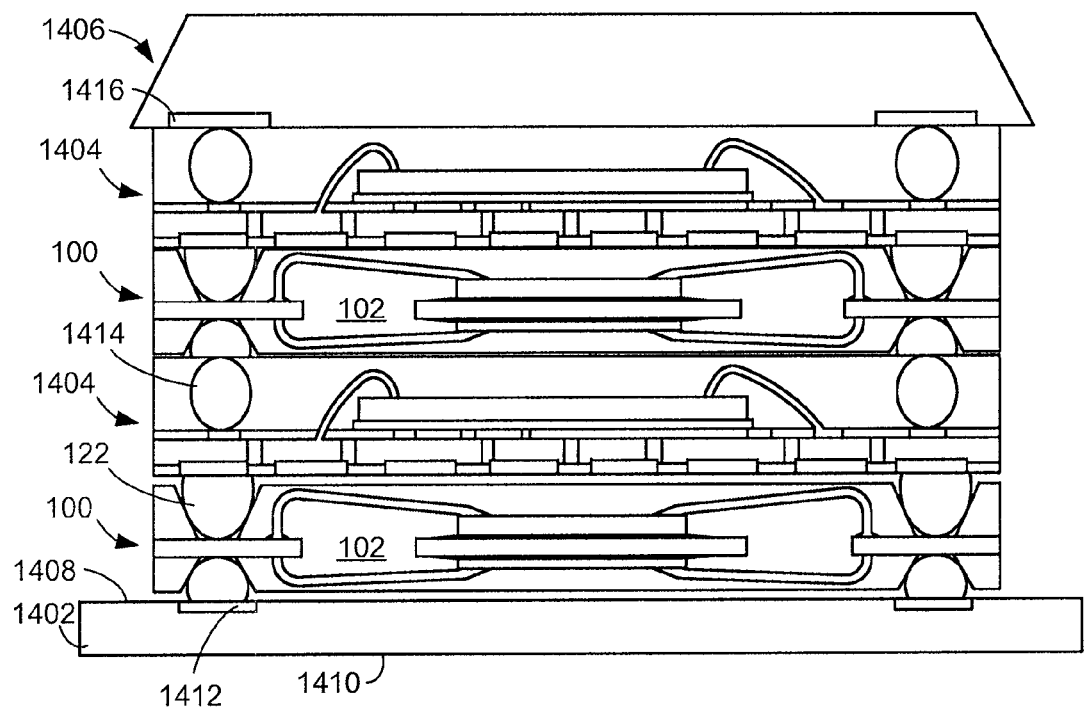
FIG. 14 is a cross-sectional view of an integrated circuit package system in a thirteenth embodiment of the present invention.

Referring now to FIG. 14, therein is shown a cross-sectional view of an integrated circuit package system 1400 in a thirteenth embodiment of the present invention. The integrated circuit package system 1400 preferably includes a substrate 1402, the integrated circuit package system 100 having the encapsulant 102, a second package 1404 such as substrate type package, and a third package 1406 such as a leaded package.

The substrate 1402 includes a first substrate surface 1408 and a second substrate surface 1410. The substrate 1402 can also include a substrate pad 1412 such as a conductive pad over the first substrate surface 1408. The substrate pad 1412 can provide electrical connectivity to connectors of next level system such as a package.

The integrated circuit package system 100 preferably includes the conductive material 122 formed as a connector. Similarly, the second package 1404 can include second package connectors 1414. In a similar manner, the third package 1406 also includes a third package pad 1416 such as a conductive pad. Multiple packages can be stacked and electrically connected one over the other.

For illustrative purposes the integrated circuit package system 1400 is shown having a stack of the third package 1406 over the one of the second package 1404 over one of the integrated circuit package system 100 over another of the second package 1404 over another of the integrated circuit package system 100 over the substrate 1402 although it is understood that any type, number, or order of packages may be used.

Figure 15:
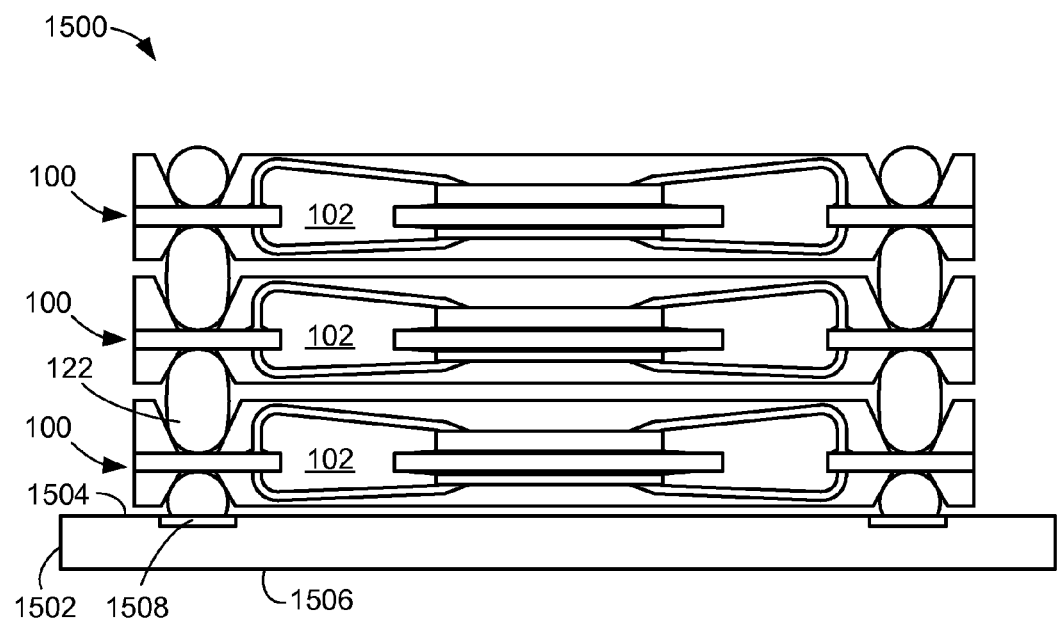
FIG. 15 is a cross-sectional view of an integrated circuit package system in a fourteenth embodiment of the present invention.

Referring now to FIG. 15, therein is shown a cross-sectional view of an integrated circuit package system 1500 in a fourteenth embodiment of the present invention. The integrated circuit package system 1500 preferably includes a substrate 1502 and the integrated circuit package system 100 having the encapsulant 102.

The substrate 1502 includes a first substrate surface 1504 and a second substrate surface 1506. The substrate 1502 can also include a substrate pad 1508 such as a conductive pad over the first substrate surface 1504. The substrate pad 1508 can provide electrical connectivity to connectors of next level system such as a package.

The integrated circuit package system 100 preferably includes the conductive material 122 formed as a connector. Multiple packages can be stacked one over the other and electrically connected by the conductive material 122.

For illustrative purposes the integrated circuit package system 1500 is shown having a stack of three of the integrated circuit package system 100 although it is understood that any number or embodiment of the present invention may be used.

Figure 16:
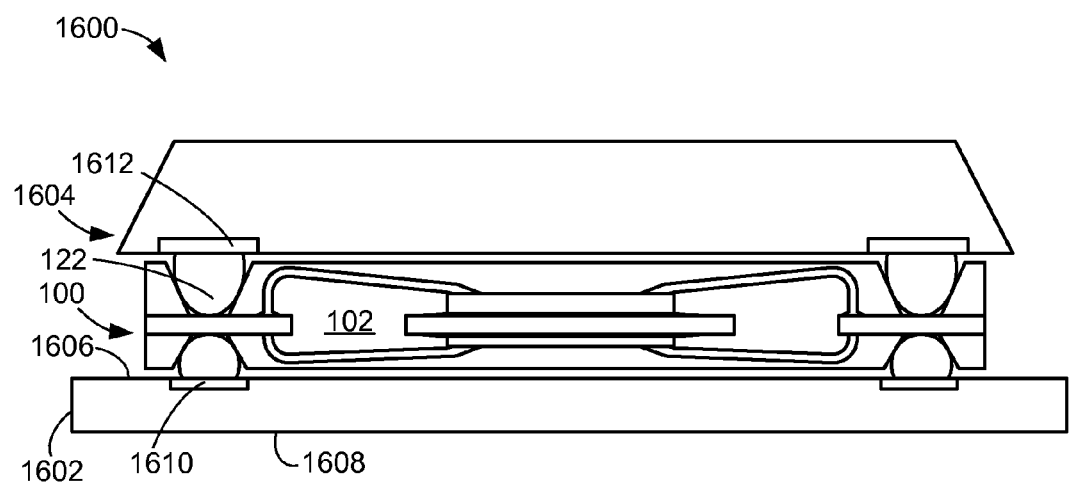
FIG. 16 is a cross-sectional view of an integrated circuit package system in a fifteenth embodiment of the present invention.

Referring now to FIG. 16, therein is shown a cross-sectional view of an integrated circuit package system 1600 in a fifteenth embodiment of the present invention. The integrated circuit package system 1600 preferably includes a substrate 1602, the integrated circuit package system 100 having the encapsulant 102, and a second package 1604 such as a leaded package.

The substrate 1602 includes a first substrate surface 1606 and a second substrate surface. The substrate 1602 can also include a substrate pad 1610 such as a conductive pad over the first substrate surface 1606. The substrate pad 1610 can provide electrical connectivity to connectors of next level system such as a package.

The integrated circuit package system 100 preferably includes the conductive material 122 formed as a connector. Similarly, the second package 1604 can include second package connectors 1612. Multiple packages can be stacked and electrically connected one over the other.

For illustrative purposes the integrated circuit package system 1600 is shown having a stack of the second package 1604 over the integrated circuit package system 100 over the substrate 1602 although it is understood that any type, number, or order of packages may be used.

Figure 17:
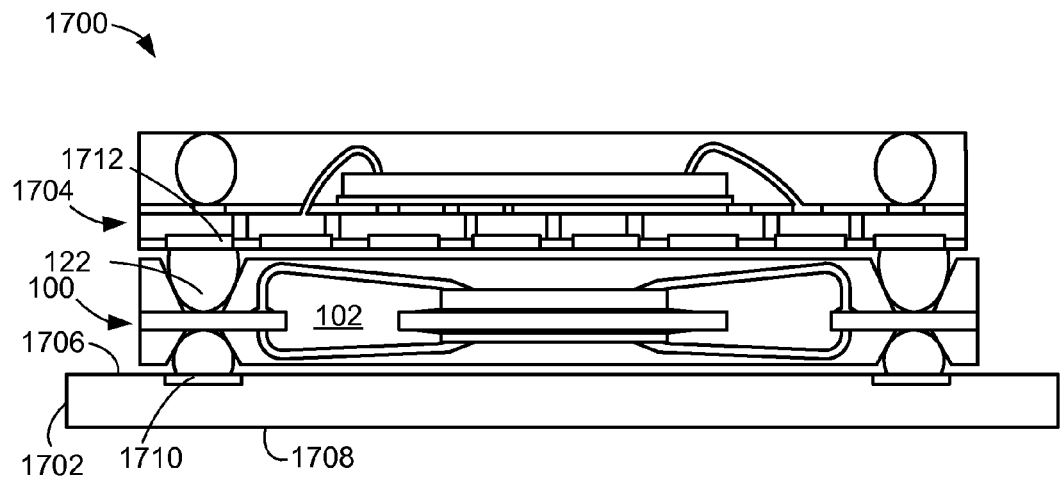
FIG. 17 is a cross-sectional view of an integrated circuit package system in a sixteenth embodiment of the present invention.

Referring now to FIG. 17, therein is shown a cross-sectional view of an integrated circuit package system 1700 in a sixteenth embodiment of the present invention. The integrated circuit package system 1700 preferably includes a substrate 1702, the integrated circuit package system 100 having the encapsulant 102, and a second package 1704 such as a substrate type package.

The substrate 1702 includes a first substrate surface 1706 and a second substrate surface 1708. The substrate 1702 can also include a substrate pad 1710 such as a conductive pad over the first substrate surface 1706. The substrate pad 1710 can provide electrical connectivity to connectors of next level system such as a package.

The integrated circuit package system 100 preferably includes the conductive material 122 formed as a connector. Similarly, the second package 1704 can include second package connectors 1712. Multiple packages can be stacked and electrically connected one over the other.

For illustrative purposes, the integrated circuit package system 1700 is shown having a stack of the second package 1704 over the integrated circuit package system 100 over the substrate 1702 although it is understood that any type, number, or order of packages may be used.

Figure 18:
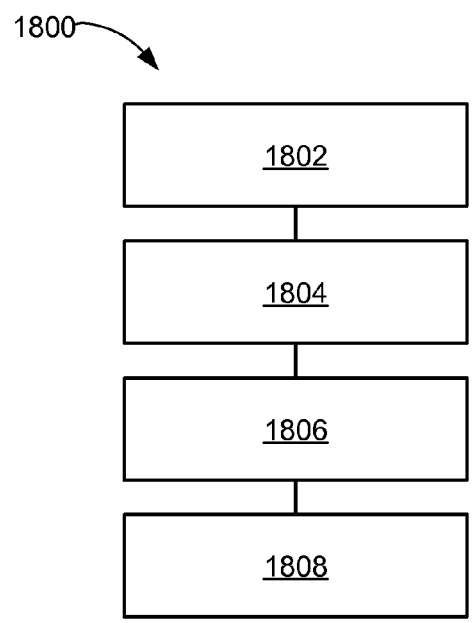
FIG. 18 is a flow chart of an integrated circuit package system for manufacturing the integrated circuit package system in an embodiment of the present invention.

Referring now to FIG. 18, therein is shown a flow chart of an integrated circuit package system 1800 for manufacturing the integrated circuit package system 100 in an embodiment of the present invention. The system 1800 includes providing a die pad with leads in a block 1802; attaching an integrated circuit over the die pad in a block 1804; attaching a connector to the integrated circuit and the leads in a block 1806; and forming an encapsulant, over the integrated circuit, having a connection cavity over the leads leaving an exposed portion of the leads in a block 1808.

In greater detail, a system to provide the method and apparatus of the integrated circuit package system 100, in an embodiment of the present invention, is performed as follows:

1. Providing a die pad with leads.
2. Attaching an integrated circuit over the die pad.
3. Attaching a connector to the integrated circuit and the leads.
4. Forming an encapsulant, over the integrated circuit, having a connection cavity over the leads leaving an exposed portion of the leads.
5. Forming a conductive material partially or fully in the connection cavity over the leads.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
    providing a die pad and leads;
    attaching a first integrated circuit over the die pad with a connection side of the first integrated circuit facing away from the die pad;

attaching a second integrated circuit over the die pad with a connection side of the second integrated circuit facing away from the die pad, and the second integrated circuit opposite the first integrated circuit;

attaching a connector to the first integrated circuit and the leads; and forming an encapsulant, over the first integrated circuit and the second integrated circuit, the encapsulant having a connection cavity over the leads leaving an exposed portion of the leads.

2. The method as claimed in claim 1 wherein forming the encapsulant includes forming the connection cavity having an open outer end near a first die pad surface of the encapsulant.

3. The method as claimed in claim 1 wherein forming the encapsulant includes forming the connection cavity having a closed inner end with the exposed portion of the leads.

4. The method as claimed in claim 1 wherein forming the encapsulant includes forming the connection cavity having a cross-sectional shape of a trapezoid.

5. The method as claimed in claim 1 further comprising stacking a second package over the encapsulant.

6. A method of manufacture of an integrated circuit package system comprising:

providing a die pad and leads;

attaching a first integrated circuit over the die pad; pad with a connection side of the first integrated circuit facing away from the die pad;

attaching a second integrated circuit over the die pad with a connection side of the second integrated circuit facing away from the die pad, and the second integrated circuit opposite the first integrated circuit;

attaching a connector to the first integrated circuit and the leads;

forming an encapsulant, over the first integrated circuit and the second integrated circuit, the encapsulant having a connection cavity over the leads leaving an exposed portion of the leads; and forming a conductive material partially in the connection cavity over the leads.

7. The method as claimed in claim 6 wherein attaching the second integrated circuit includes attaching the second integrated circuit over a second die pad surface of the die pad.

8. The method as claimed in claim 6 wherein attaching the connector includes:

attaching the second integrated circuit over a second die pad surface of the die pad; and attaching a second connector to the second integrated circuit and the leads.

9. The method as claimed in claim 6 wherein attaching the second integrated circuit includes attaching the second integrated circuit wherein the second integrated circuit is substantially the same as the first integrated circuit.

10. The method as claimed in claim 6 wherein attaching the second integrated circuit includes attaching the second integrated circuit wherein the second integrated circuit is different from the first integrated circuit.

11. An integrated circuit package system comprising:

a die pad;

leads;

a first integrated circuit over the die pad with a connection side of the first integrated circuit facing away from the die pad;

a second integrated circuit over the die pad with a connection side of the second integrated circuit facing away from the die pad, and the second integrated circuit opposite the first integrated circuit;

a connector attached to the first integrated circuit and the leads; and an encapsulant, over the first integrated circuit and the second integrated circuit, the encapsulant having a connection cavity over the leads leaving an exposed portion of the leads.

12. The system as claimed in claim 11 wherein the encapsulant includes the connection cavity having an open outer end near a first die pad surface of the encapsulant.

13. The system as claimed in claim 11 wherein the encapsulant includes the connection cavity having a closed inner end with the exposed portion of the leads.

14. The system as claimed in claim 11 wherein the encapsulant includes the connection cavity having a cross-sectional shape of a rectangle or a partial ellipse.

15. The system as claimed in claim 11 further comprising a second package such as a substrate type package, a leaded package, or a nonleaded package stacked over the encapsulant.

16. The system as claimed in claim 11 further comprising:

forming a conductive material partially in the connection cavity over the leads.

17. The system as claimed in claim 16 wherein the second integrated circuit is over a second die pad surface of the die pad.

18. The system as claimed in claim 16 further comprising:

a second die pad surface of the die pad having the second integrated circuit thereover; and a second connector to the second integrated circuit and the leads.

19. The system as claimed in claim 16 wherein the second integrated circuit is substantially the same as the first integrated circuit.

20. The system as claimed in claim 16 wherein the second integrated circuit is different from the first integrated circuit.

* * * * *

UNITED STATES PATENT AND TRADEMARK OFFICE
CERTIFICATE OF CORRECTION

| | | |
|---|---|---|
| PATENT NO. | : 7,763,493 B2 | Page 1 of 1 |
| APPLICATION NO. | : 11/768730 | |
| DATED | : July 27, 2010 | |
| INVENTOR(S) | : Tay et al. | |

It is certified that error appears in the above-identified patent and that said Letters Patent is hereby corrected as shown below:

<u>Column 13</u>:

Claim 6, line 25, delete "die pad; pad with" and insert therefor --die pad with--

Signed and Sealed this

Sixteenth Day of November, 2010

David J. Kappos
*Director of the United States Patent and Trademark Office*